United States Patent
Fan et al.

(10) Patent No.: US 6,924,335 B2
(45) Date of Patent: Aug. 2, 2005

(54) THERMAL INTERFACE MATERIAL AND METHOD FOR MAKING SAME

(75) Inventors: Shoushan Fan, Beijing (CN); Pao Lo Liu, E. Amherst, NY (US); Hua Huang, Beijing (CN); YoungDe Li, Beijing (CN)

(73) Assignees: Hon Hai Precision Ind. Co., Ltd., Taipei Hsien (TW); Tsinghua University, Beijing (CN)

(*) Notice: Subject to any disclaimer, the term of this patent is extended or adjusted under 35 U.S.C. 154(b) by 0 days.

(21) Appl. No.: 10/404,392

(22) Filed: Mar. 31, 2003

(65) Prior Publication Data

US 2004/0097635 A1 May 20, 2004

(30) Foreign Application Priority Data

Nov. 14, 2002 (CN) ..................................... 02 1 52003 A

(51) Int. Cl.[7] .............................. C08L 3/04; C08L 75/04
(52) U.S. Cl. ........................ 524/495; 524/871; 524/875; 165/185; 361/704
(58) Field of Search ................................ 524/495, 847; 165/185; 361/704

(56) References Cited

U.S. PATENT DOCUMENTS

| 6,407,922 | B1 | * | 6/2002 | Eckblad et al. ............. 361/704 |
| 6,741,019 | B1 | * | 5/2004 | Filas et al. .................. 313/355 |
| 2002/0100581 | A1 | * | 8/2002 | Knowles et al. ............ 165/185 |
| 2003/0111333 | A1 | * | 6/2003 | Montgomery et al. ....... 204/164 |
| 2003/0117770 | A1 | * | 6/2003 | Montgomery et al. ....... 361/687 |
| 2004/0005736 | A1 | * | 1/2004 | Searls et al. ................ 438/122 |

* cited by examiner

*Primary Examiner*—David W. Wu
*Assistant Examiner*—Rip A Lee
(74) *Attorney, Agent, or Firm*—Wei Te Chung

(57) ABSTRACT

A thermal interface material (40) includes a polymer matrix (32) and an array of carbon nanotubes (22) incorporated in the polymer matrix. The polymer matrix has a thermally conductive first face (42) and an opposite thermally conductive second face (44). The carbon nanotubes are substantially parallel to each other, and extend between the first and the second faces. A preferred method for making the thermal interface material includes the steps of: (a) forming the array of carbon nanotubes on a substrate (11); (b) immersing the carbon nanotubes in a liquid prepolymer (31) such that the liquid prepolymer infuses into the array of carbon nanotubes; (c) polymerizing the liquid prepolymer to obtain the polymer matrix having the carbon nanotubes secured therein; and (d) peeling the polymer matrix having the carbon nanotubes off from the substrate to obtain the thermal interface material.

13 Claims, 2 Drawing Sheets

THERMAL INTERFACE MATERIAL AND METHOD FOR MAKING SAME

BACKGROUND OF THE INVENTION

1. Field of the Invention

The present invention relates to a thermal interface material and a method for making the same, especially to a thermal interface material made from carbon nanotubes and a method for making such a material.

2. Description of Related Art

Nowadays semiconductor devices are smaller and run faster than ever before. These devices also generate more heat than ever before. A semiconductor device should be kept within its operational temperature limits to ensure good performance and reliability. Typically, a heat sink is attached to a surface of the semiconductor device. Heat is transferred from the semiconductor device to ambient air via the heat sink. When attaching the heat sink to the semiconductor device, respective surfaces thereof are brought together into intimate contact. No matter how precisely the heat sink and semiconductor device are manufactured, as much as 99% of the respective surfaces are separated by a layer of interstitial air. Therefore a thermal interface material is used to eliminate air gaps from a thermal interface and to improve heat flow through the thermal interface.

Conventional thermal interface materials are thermally conductive compounds prepared by dispersing a number of thermally conductive fillers into a polymer matrix. The thermally conductive fillers can be graphite, boron nitride, silicon oxide, alumina, and so on. However, polymers have poor thermonductivity. A typical thermal conductivity of a conventional thermal interface material is only about 1 W/mK.

A paper by Nancy Mathis entitled "Thermal conductivity of thin film carbon fiber die attach" (published in RETEC'98 proceedings) discloses a thermal interface material. The thermal interface material binds z-axis carbon fibers in an epoxy matrix. The material can be as little as 76 $\mu$m (micrometers) thick, with a thermal conductivity in the range from 140 W/mK to 400 W/mK. However, even this thickness has inherent limitations. Thermal resistance of a thermal interface material is proportional to its thickness. A thickness of less than 40 $\mu$m would yeild even higher thermal conductivity.

Savas Berber et al. in "Unusually High Thermal Conductivity of Carbon Nanotubes" (Physics Review Letter, 84, 4613, February, 2000) discloses that a thermoconductivity of an isolated carbon nanotube is 6600 W/mK at room temperature.

U.S. Pat. No. 6,407,922 discloses a thermally conductive material including carbon nanotubes. The thermally conductive material comprises a matrix material and carbon nanotubes incorporated therein. The thermally conductive material includes a first surface adjacent a heat source and a second opposite surface adjacent a heat dissipator. The first surface has a smaller area than the second surface. The carbon nanotubes each extend generally between the first and second surfaces, and splay from the first surface to the second surface. However, the carbon nanotubes are not regularly arranged in the matrix material, and can have poor orientation relative to the first and second surfaces. Consequently, heat cannot be uniformly and efficiently transferred from the first surface to the second surface.

SUMMARY OF THE INVENTION

Accordingly, an object of the present invention is to provide a thermal interface material which is less than 40 $\mu$m thick, and which has uniform and high thermoconductivity.

Another object of the present invention is to provide a method for making a thermal interface material having carbon nanotubes and good thermoconductivity.

In order to achieve the objects set out above, a thermal interface material in accordance with the present invention comprises a polymer matrix and an array of carbon nanotubes incorporated in the polymer matrix. The polymer matrix has a thermally conductive first face and an opposite thermally conductive second face. The carbon nanotubes are substantially parallel to each other, and extend between the first and second faces.

A preferred method for making the thermal interface material of the present invention comprises the steps of: (1) forming the array of carbon nanotubes on a substrate; (2) immersing the carbon nanotubes in a liquid prepolymer such that the liquid prepolymer infuses into the array of carbon nanotubes; (3) polymerizing the liquid prepolymer to obtain the polymer matrix having the carbon nanotubes secured therein; and (4) peeling the polymer matrix having the carbon nanotubes off from the substrate to obtain the thermal interface material.

The prepolymer is generally a reaction product of a polyether polyol and an isocyanate. The polyether polyol can be polyether dihydric alcohol, polyether trihydric alcohol, or polyether tetrahydric alcohol. The isocyanate can be toluene diisocyanate, methylene bisphenyl isocyanate, hexamethylene diisocyanate, or isophorone diisocyanate The isocyanate can be also a reaction product of diisocyanate and trihydric methyl propane, in which case the resultant isocyanate has a functionality of 3.

These and other features, aspects and advantages of the present invention will become more apparent from the following detailed description and claims, and from the accompanying drawings in which:

DETAILED DESCRIPTION OF THE PRESENT INVENTION

Reference will now be made to the drawings to describe the present invention in detail.

Figure 6:
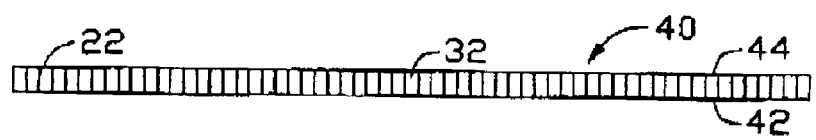
FIG. 6 is a schematic side elevation view of a thermal interface material of the present invention obtained by performing the process shown in FIG. 5.

Referring to FIG. 6, a thermal interface material 40 in accordance with a preferred embodiment of the present invention comprises a polymer matrix 32 having a thermally conductive first face 42 and an opposite thermally conductive second face 44. An array of carbon nanotubes 22 is incorporated in the polymer matrix 32. The carbon nanotubes 22 are substantially parallel to each other, and extend between the first and second faces 42, 44.

Referring also to FIGS; 1–5, a preferred method for making the thermal interface material 40 comprises the steps of:

(1) providing a substrate 11, and forming the array of carbon nanotubes 22 on the substrate 11;

(2) immersing the carbon nanotubes 22 in a liquid prepolymer 31 such that the liquid prepolymer 31 infuses into the array of carbon nanotubes 22;

(3) polymerizing the liquid prepolymer 31 to obtain the polymer matrix 32 having the carbon nanotubes 22 secured therein; and (4) peeling the polymer matrix 32 having the carbon nanotubes 22 off from the substrate 11 to obtain the thermal interface material 40.

In step (1), the substrate 11 is preferably porous silicon. Alternatively, the substrate 11 may be quartz, glass or alumina. A layer of catalyst 12 is deposited on the substrate 11 by way of thermal evaporation deposition, electron beam deposition or sputter deposition. The catalyst 12 can be iron (Fe), cobalt (Co), nickel (Ni), or any suitable combination alloy thereof. The treated substrate 11 is then annealed in air at a temperature of 300° C.

Figure 1:
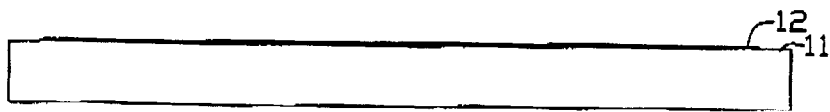
FIG. 1 is a schematic side elevation view of a substrate with a layer of catalyst deposited thereon, in accordance with the preferred method of the present invention.
Figure 2:
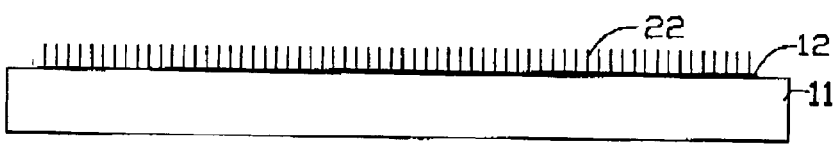
FIG. 2 is similar to FIG. 1, but showing an array of carbon nanotubes formed on the catalyst layer of the substrate of FIG. 1.

Referring to FIG. 2, a carbon source gas (not shown) is introduced. The carbon nanotubes 22 are thus formed, extending from the treated substrate 11. The carbon source gas may be acetylene, ethylene or another suitable hydrocarbon compound. A length of the carbon nanotubes 22 can be controlled to be in the range from 1 $\mu$m to 100 $\mu$m. Accordingly, a thickness of the obtained thermal interface material 40 is also in the range from 1 $\mu$m to 100 m.

Figure 3:
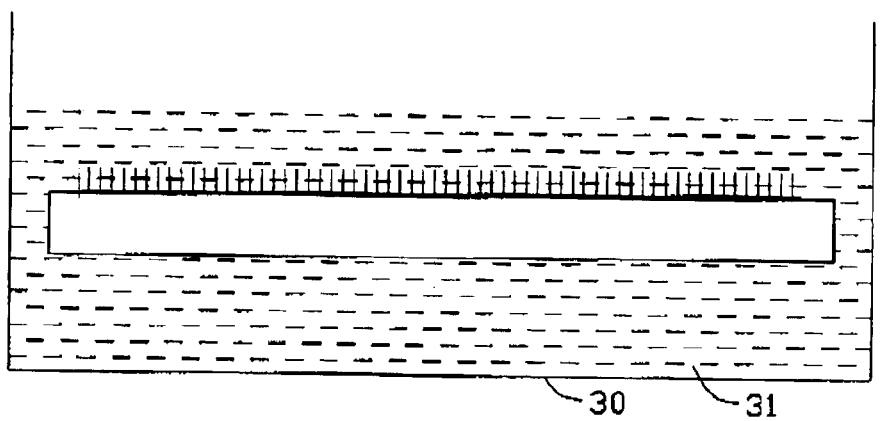
FIG. 3 is a schematic side elevation view of the substrate with the carbon nanotubes of FIG. 2 immersed in a liquid prepolymer in a vessel.

Referring to FIG. 3, in step (2), the substrate 11 having the carbon nanotubes 22 is immersed in the liquid prepolymer 31. The liquid prepolymer 31 is contained in a vessel 30, and the substrate 11 is immersed for a period of time sufficient for the liquid prepolymer 31 to infuse into the carbon nanotubes 22. The period of time required is generally associated with lengths of the array of carbon nanotubes 22, and a density and an area of the array of carbon nanotubes 22.

The prepolymer 31 is generally a reaction product of a polyether polyol and an isocyanate. Preferably, a molecular weight of the polyether polyol is in the range from 300 to 3000, and a functionality of the polyether polyol is in the range from 2 to 4. Preferably, a molecular weight of the isocyanate is in the range from 100 to 300, and a functionality of the isocyanate is 2 or 3. A molecular chain unit of the prepolymer 31 can be acyclic or aromatic. A desired ductility strength of the prepolymer 31 can be obtained by modulating the molecular weight and functionality of the polyether polyol and the isocyanate.

The polyether polyol can be a polyether dihydric alcohol, a polyether trihydric alcohol, or a polyether tetrahydric alcohol. A polyether dihydric alcohol is generally a polymerization product of alkene oxides and an ethylene glycol used as an initiator. The alkene oxide may be ethylene oxide or propylene oxide. A polyether trihydric alcohol is generally a polymerization product of alkene oxides and a glycerine used as an initiator. The alkene oxide may be ethylene oxide or propylene oxide. The polyether tetrahydric alcohol is generally a polymerization product of alkene oxides and a pentaerythritol as an initiator. The alkene oxide may be ethylene oxide or propylene oxide.

The isocyanate can be toluene diisocyanate (TDI), methylene bisphenyl isocyanate (MDI), hexamethylene diisocyanate (HDI), or isophorone diisocyanate (IPDI). The isocyanate can also be a reaction product of diisocyanate and trihydric methyl propane, in which case the resultant isocyanate has a functionality of 3.

An exemplary method for preparing the prepolymer 31 using a polyether dihydric alcohol and MDI as precursors comprises the steps of:

(a) vacuum-dehydrating a polyether dihydric alcohol at a temperature higher than 100° C., preferably in the range from 110° C. to 140° C., for about 2 hours;

(b) adding a predetermined amount of MDI into a vessel;

(c) agitating and heating the MDI until the MDI is fully melted;

(d) adding the dehydrated polyether dihydric alcohol into the vessel, and fully mixing the dehydrated polyether dihydric alcohol with the MDI;

(e) effecting a reaction of the mixture obtained in step (d) by increasing a temperature of the mixture up to 80~85° C.; and (f) testing a content of isocyanate (hereinafter "NCO") radicals in the mixture by potentiometric titration during the performance of step (e), and terminating the reaction once the content of NCO radicals reaches a predetermined value.

In order to make the liquid prepolymer 31 fully infuse into the carbon nanotubes 22, a viscosity of the prepolymer 31 is preferably less than 100 mps. The viscosity of the liquid prepolymer 31 can be adjusted by adding in an appropriate mount of inert solvent. The inert solvent can be propyl acetate, isopentyl acetate, acetone, butanone, cyclohexanone, dichloroethane, trichloroethane or tetrachloroethane. A mass of the inert solvent should be less than 20 percent of a mass of the liquid prepolymer 31.

Figure 4:
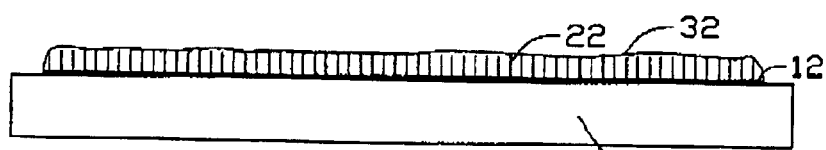
FIG. 4 is schematic side elevation view of the substrate with the carbon nanotubes of FIG. 3 after immersion in the liquid prepolymer, showing the array of carbon nanotubes incorporated in a polymer matrix.
Figure 5:
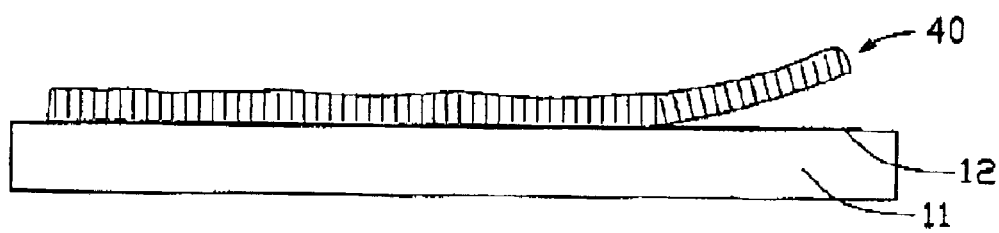
FIG. 5 is similar to FIG. 4, but showing a process of peeling the polymer matrix having the carbon nanotubes off from the substrate.

Referring to FIGS. 4 and 5, in step (3), the substrate 11 having the carbon nanotubes 22 is taken out from the prepolymer 31, and is polymerized for 24 hours in ambient air having a relative humidity of less than 40%. The resultant polymer matrix 32 having the carbon nanotubes 22 is then peeled off from the substrate 11, and is further cured for 72 hours so that the prepolymer is completely polymerized.

Referring to FIG. 6, the carbon nanotubes are integrated in situ in the polymer matrix 32. Almost all the carbon nanotubes 22 keep their original orientation in the polymer matrix 32. That is, longitudinal axes of the carbon nanotubes 22 are substantially perpendicular to the first and second faces 42, 44 of the thermal interface material 40. The obtained thermal interface material 40 has a tensile strength in the range from 0.5 Mpa to 2 Mpa, and a value of elongation at break thereof in the range from 50% to 600%. The thermal interface material 40 is also oil resistant, heat resistant, and resistant to aging.

Figure 7:
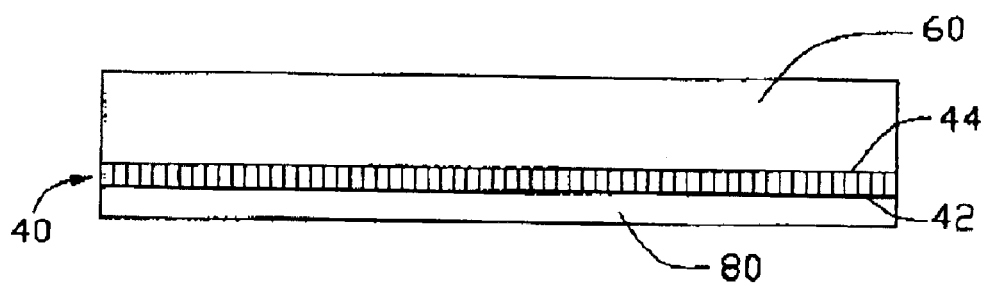
FIG. 7 is a schematic side elevation view of the thermal interface material of FIG. 6 used between a heat generating electronic device and a heat dissipator.

Referring to FIG. 7, in a typical application, the thermal interface material 40 is sandwiched between a heat generating electronic device 80, such as a central processing unit (CPU) 80, and a heat dissipator 60, such as a heat sink 60. The first face 42 of the thermal interface material 40 contacts a top surface of the CPU 80, and the second face 44 of the thermal interface material 40 contacts a bottom surface of the heat sink 60. The carbon nanotubes 22 are substantially parallel to each other in the polymer matrix 32, and extend between the first face 42 and the second face 44. Due to high thermal conductivity of the carbon nanotubes 22 along their longitudinal axes, correspondingly high thermal conductivity between the CPU 80 and the heat sink 60 is attained.

While the present invention has been described with reference to particular embodiments, the description is illustrative of the invention and is not to be construed as limiting the invention. Therefore, various modifications of the described embodiments can be made by those skilled in the art without departing from the true spirit and scope of the invention as defined by the appended claims.

What is claimed is:

1. A method for making a thermal interface material, the method comprising the steps of:

(1) forming an array of carbon nanotubes;

(2) immersing the array of carbon nanotubes in a liquid prepolymer such that the liquid prepolymer infuses into the array of carbon nanotubes; and (3) polymerizing the liquid prepolymer to obtain a matrix having the carbon nanotubes secured therein.

2. The method as recited in claim 1, wherein a viscosity of the prepolymer is less than 100 mps.

3. The method as recited in claim 2, wherein the viscosity of the prepolymer is adjusted by adding an inert solvent thereto.

4. The method as recited in claim 3, wherein the inert solvent is selected from the group consisting of propyl acetate, isopentyl acetate, acetone, butanone, cyclohexanone, dichloroethane, trichloroethane and tetrachloroethane.

5. The method as recited in claim 3, wherein a mass of the inert solvent is less than 20 percent of a mass of the prepolymer.

6. The method as recited in claim 2, wherein the prepolymer comprises a polyether polyol and an isocyanate.

7. The method as recited in claim 6, wherein a molecular weight of the polyether polyol is in the range from 300 to 3000, and a functionality of the polyether polyol is in the range from 2 to 4.

8. The method as recited in claim 7, wherein the polyether polyol is selected from the group consisting of polyether dihydric alcohol, polyether trihydric alcohol and polyether tetrahydric alcohol.

9. The method as recited in claim 6, wherein a molecular weight of the isocyanate is in the range from 100 to 300, and a functionality of the isocyanate is in the range from 2 to 3.

10. The method as recited in claim 6, wherein the isocyanate is selected from the group consisting of toluene diisocyanate, methylene bisphenyl isocyanate, hexamethylene diisocyanate and isophorone diisocyanate.

11. The method as recited in claim 6, wherein the isocyanate is obtained by reaction of diisocyanate and trihydric methyl propane, in which case the isocyanate has a functionality of 3.

12. The method as recited in claim 1, wherein the carbon nanotubes are formed on a substrate by chemical vapor deposition.

13. The method as recited in claim 12, further comprising the step of: (4) peeling the matrix having the carbon nanotubes off from the substrate.

* * * * *